United States Patent
Gu et al.

(10) Patent No.: US 6,562,700 B1
(45) Date of Patent: *May 13, 2003

(54) PROCESS FOR REMOVAL OF RESIST MASK OVER LOW K CARBON-DOPED SILICON OXIDE DIELECTRIC MATERIAL OF AN INTEGRATED CIRCUIT STRUCTURE, AND REMOVAL OF RESIDUES FROM VIA ETCH AND RESIST MASK REMOVAL

(75) Inventors: Sam Gu, Vancouver, WA (US); David Pritchard, Portland, OR (US); Derryl D. J. Allman, Camas, WA (US); Ponce Saopraseuth, Gresham, OR (US); Steve Reder, Boring, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/873,043

(22) Filed: May 31, 2001

(51) Int. Cl.[7] ................. H01L 21/322; H01L 21/302; H01L 21/461
(52) U.S. Cl. .................. 438/477; 438/710; 438/725
(58) Field of Search .............................. 438/725, 624, 438/477, 710

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |

(List continued on next page.)

FOREIGN PATENT DOCUMENTS

| | | | |
|---|---|---|---|
| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

(List continued on next page.)

*Primary Examiner*—William David Coleman
(74) *Attorney, Agent, or Firm*—John P. Taylor

(57) ABSTRACT

A process is disclosed for removing a photoresist mask used to form openings in an underlying layer of low k carbon-doped silicon oxide dielectric material of an integrated circuit structure formed on a semiconductor substrate, which comprises exposing the photoresist mask in a plasma reactor to a plasma formed using a reducing gas until the photoresist mask is removed. In a preferred embodiment the reducing gas is selected from the group consisting of $NH_3$, $H_2$, forming gas, and a mixture of $NH_3$ and $H_2$. The process further provides for the removal of etch residues by first contacting the low k carbon-doped silicon oxide dielectric material with a solvent capable of dissolving and/or removing etch residues left from forming the openings in the low k dielectric material, and from removing the photoresist mask used to form the openings in the low k carbon-doped silicon oxide dielectric material; and then annealing the substrate in an annealing chamber at a temperature sufficient to remove liquid and gaseous byproducts from the low k carbon-doped silicon oxide dielectric material.

28 Claims, 1 Drawing Sheet

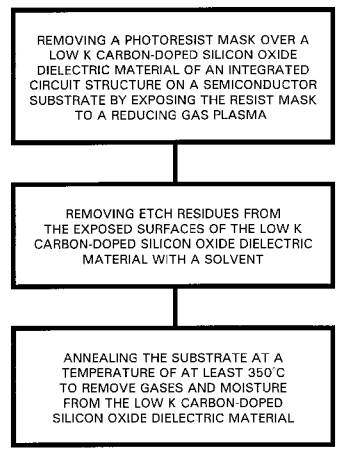

U.S. PATENT DOCUMENTS

| | | | |
|---|---|---|---|
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,660,682 A | 8/1997 | Zhao et al. | 438/715 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III et al. | |
| 5,939,763 A | 8/1999 | Hao et al. | 257/411 |
| 5,989,998 A | 11/1999 | Sugahara et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau et al. | |
| 6,063,702 A | 5/2000 | Chung | |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,281,135 B1 * | 8/2001 | Han et al. | 438/725 |
| 6,316,354 B1 * | 11/2001 | Hu | 438/624 |
| 6,346,488 B1 | 2/2002 | Kabansky | |
| 6,346,490 B1 | 2/2002 | Catabay et al. | |
| 6,350,700 B1 | 2/2002 | Schinella et al. | |

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

* cited by examiner

REMOVING A PHOTORESIST MASK OVER A LOW K CARBON-DOPED SILICON OXIDE DIELECTRIC MATERIAL OF AN INTEGRATED CIRCUIT STRUCTURE ON A SEMICONDUCTOR SUBSTRATE BY EXPOSING THE RESIST MASK TO A REDUCING GAS PLASMA

REMOVING ETCH RESIDUES FROM THE EXPOSED SURFACES OF THE LOW K CARBON-DOPED SILICON OXIDE DIELECTRIC MATERIAL WITH A SOLVENT

ANNEALING THE SUBSTRATE AT A TEMPERATURE OF AT LEAST 350°C TO REMOVE GASES AND MOISTURE FROM THE LOW K CARBON-DOPED SILICON OXIDE DIELECTRIC MATERIAL

PROCESS FOR REMOVAL OF RESIST MASK OVER LOW K CARBON-DOPED SILICON OXIDE DIELECTRIC MATERIAL OF AN INTEGRATED CIRCUIT STRUCTURE, AND REMOVAL OF RESIDUES FROM VIA ETCH AND RESIST MASK REMOVAL

CROSS-REFERENCE TO RELATED APPLICATIONS

The subject matter of this application relates to the subject matter of copending U.S. patent application Ser. No. 09/872,058, entitled "PROCESS FOR FORMING A LOW K CARBON-DOPED SILICON OXIDE DIELECTRIC MATERIAL ON AN INTEGRATED CIRCUIT STRUCTURE", assigned to the assignee of this application, and filed on the same date as this application, the subject matter of which is hereby incorporated by reference.

The subject matter of this application relates to the subject matter of U.S. Pat. No. 6,316,354, issued Nov. 13, 2001, entitled "PROCESS FOR REMOVING RESIST MASK OF INTEGRATED CIRCUIT STRUCTURE WHICH MITIGATES DAMAGE TO UNDERLYING LOW DIELECTRIC CONSTANT SILICON OXIDE DIELECTRIC LAYER", assigned to the assignee of this application, the subject matter of which is hereby incorporated by reference.

BACKGROUND OF THE INVENTION

1. Field of the Invention

This invention relates to a process for an integrated circuit structure having a layer of low k carbon-doped silicon oxide dielectric material. More particularly, this invention relates to the removal of a resist mask used to form an opening such as a via or a trench in the low k dielectric material and the removal of residues from both the etching of the opening and the subsequent resist mask removal.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The use of low k carbon-doped silicon oxide dielectric material formed by reacting methyl silane with hydrogen peroxide (the Trikon process) has been found to be capable of better gap filling characteristics than other low k materials. Good gap filling characteristics, in turn, can result in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, it has been found that the bond formed between the silicon atoms and the organic groups in a carbon-doped silicon oxide dielectric material is not as stable as the silicon-oxygen bond found in conventional silicon oxide ($SiO_2$) materials. For example, unprotected surfaces of such a low k carbon doped silicon oxide dielectric material may be exposed to oxidizing or "ashing" systems, which are used to remove a photoresist mask from the layer of low k carbon doped silicon oxide dielectric material, after formation of openings, such as vias, therein. It has been found that the ashing process results in damage to the bonds (cleavage) between the organic groups and the silicon atoms adjacent the surfaces of the layer of low k carbon doped silicon oxide dielectric material exposed to such an ashing treatment. This cleavage of the carbon-silicon bonds, in turn, results in removal of such organic materials formerly bonded to the silicon atoms along with the organic photoresist materials being removed from the integrated circuit structure. The silicon atoms from which the organic groups have been cleaved, and which are left in the damaged surface of low k carbon doped silicon oxide dielectric material, are in a highly reactive state and become water absorption sites if and when the damaged surface is exposed to moisture.

This absorption of moisture by the damaged low k carbon doped silicon oxide dielectric material, results in hydroxyl bonding to the reactive silicon atoms left from the cleavage of the carbon-silicon bonds in the damaged surfaces of the low k carbon doped silicon oxide dielectric material. This silicon-hydroxyl bond is not a stable bond, and subsequent exposure to heat, e.g., during subsequent processing such as annealing, can result in cleavage of the silicon-hydroxyl bond, thereby causing water vapor formation which, for example, can interfere with subsequent filling of a via/contact opening or a damascene trench with metal filler material, resulting in what is known as via poisoning.

The upper surface of the low k carbon doped silicon oxide dielectric material can be protected from such attack during removal of the resist mask by provision of a protective layer, e.g. a capping layer of silicon oxide over the upper surface. However, the use of the conventional ashing (oxidation) process to remove the resist mask causes physical damage to any carbon doped silicon oxide material which is exposed in walls of vias, trenches, or contact openings, resulting in cracked, degraded, bowed, and porous insulating material in the walls of such openings. The pores in the walls of vias, trenches, or contact openings can present further problems by retaining destructive gases produced during one or more subsequent metal deposition steps. The physical damage to the insulating material which forms the walls of such openings cause the subsequent metal deposition step to be unreliable; and the presence, in the pore cavities, of gases produced during metal deposition steps result in a degradation of the metal/metal nitride properties.

Zukharev et al. U.S. Pat. No. 6,114,259, assigned to the assignee of this invention, and the subject matter of which is hereby incorporated by reference, teaches removal of the photoresist mask used to form openings such as vias in low k carbon-doped silicon oxide dielectric material in a two step process wherein the etched via sidewalls of the low k carbon-doped silicon oxide dielectric material are first treated with a nitrogen plasma, or a nitrogen and oxygen plasma, to densify the exposed low k carbon-doped silicon oxide dielectric material. The photoresist mask is then removed with a mild oxidizing agent comprising an $H_2O$ plasma. The $H_2O$ plasma removes the resist mask without damaging the exposed low k carbon-doped silicon oxide dielectric material comprising the sidewalls of the etched via sufficiently to interfere with later filling of the via with an electrically conductive metal filler.

Wang et al. U.S. Pat. No. 6,028,015, also assigned to the assignee of this invention, and the subject matter of which is also hereby incorporated by reference, teaches treating damaged via sidewalls of low k carbon-doped silicon oxide dielectric material with either a hydrogen plasma or a nitrogen plasma to repair the via sidewall surfaces which have been damaged by prior removal of the photoresist mask with a traditional ashing/oxidation process, i.e., an oxygen plasma. Such a treatment with a hydrogen or nitrogen plasma is said to cause the hydrogen or nitrogen to bond to silicon atoms with dangling bonds left in the damaged surface of the low dielectric constant organo silicon oxide insulation layer to replace organo material severed from such silicon atoms at the damaged surface. Absorption of moisture in the damaged surface of the low dielectric constant organo silicon oxide insulation layer, by bonding of such silicon with moisture, is thereby inhibited.

John Hu U.S. Pat. No. 6,316,354, issued Nov. 13, 2001, also assigned to the assignee of this invention, and the subject matter of which is also hereby incorporated by reference, discloses a process for removing resist mask material from a protective barrier layer formed over a layer of low k silicon oxide dielectric material of an integrated circuit structure without damaging the low k dielectric material, and without the necessity of subjecting the exposed via sidewalls of the low k dielectric material to either a pretreatment to inhibit subsequent damage to the low k dielectric material during the resist removal, or a post treatment to repair damage to the low k material after the resist removal. The resist removal process comprises exposing the resist mask material to a hydrogen plasma formed from a source of hydrogen such as ammonia, while maintaining the temperature below about 40° C. to inhibit attack of the low k silicon oxide dielectric material by oxygen released from the decomposition of the resist material.

However, it would be desirable to provide a method for processing a low k carbon doped silicon oxide dielectric material, located on an integrated circuit structure, in a manner which will protect surfaces of the low k carbon doped silicon oxide dielectric material exposed by formation of one or more vias therein from being damaged during removal of the etch mask and without requiring pretreatment of the exposed surfaces of the low k carbon-doped silicon oxide dielectric material prior to removal of the resist mask. It would also be desirable to provide for the removal of residues from both the via etch step and the resist mask removal in a manner which will not interfere with subsequent filing, with electrically conductive material such as metals, of the vias or other openings in the low k carbon-doped silicon oxide material.

SUMMARY OF THE INVENTION

A process is provided for removing a photoresist mask used to form openings in an underlying layer of low k carbon-doped silicon oxide dielectric material of an integrated circuit structure formed on a semiconductor substrate, which comprises exposing the photoresist mask in a plasma reactor to a plasma formed using a reducing gas until the photoresist mask is removed. In a preferred embodiment the reducing gas is selected from the group consisting of $NH_3$, $H_2$, and a mixture of $NH_3$ and $H_2$. The process further provides for the removal of etch residues by first contacting the low k carbon-doped silicon oxide dielectric material with a solvent capable of dissolving etch residues left from forming the openings in the low k dielectric material, and from removing the photoresist mask used to form the openings in the low k carbon-doped silicon oxide dielectric material; and then annealing the substrate in an annealing chamber at a temperature sufficient to remove liquid and gaseous byproducts from the low k carbon-doped silicon oxide dielectric material.

BRIEF DESCRIPTION OF THE DRAWINGS

The sole drawing is a flow sheet illustrating one embodiment of the process of the invention

DETAILED DESCRIPTION OF THE INVENTION

The invention comprises a process for removing a photoresist mask used to form openings in an underlying layer of low k carbon-doped silicon oxide dielectric material of an integrated circuit structure formed on a semiconductor substrate, which comprises exposing the photoresist mask in a plasma reactor to a plasma formed using a reducing gas until the photoresist mask is removed. In a preferred embodiment the reducing gas is selected from the group consisting of $NH_3$, $H_2$, and a mixture of $NH_3$ and $H_2$. The process further provides for the removal of etch residues by first contacting the low k carbon-doped silicon oxide dielectric material with a solvent capable of dissolving etch residues left from forming the openings in the low k dielectric material, and from removing the photoresist mask used to form the openings in the low k carbon-doped silicon oxide dielectric material; and then annealing the substrate in an annealing chamber at a temperature sufficient to remove liquid and gaseous byproducts from the low k carbon-doped silicon oxide dielectric material.

The low k carbon-doped silicon oxide dielectric material, in which the openings are formed through the photoresist mask, comprises the reaction product of a mild oxidizing agent, such as a peroxide, and an organo-substituted silane. Such a low k carbon-doped silicon oxide dielectric material, for example, may be formed using methyl silane ($CH_3SiH_3$), as described in the previously referenced Peters and McClatchie et al. articles. Alternatively, the low k carbon-doped silicon oxide dielectric material may also comprise, for example, the reaction product of hydrogen peroxide with a multiple carbon-substituted silane such as described in U.S. Pat. No. 6,303,047, issued Oct. 16, 2001, and assigned to the assignee of this invention, the subject matter of which is hereby incorporated by reference. The low k carbon-doped silicon oxide dielectric material might also comprise the reaction product of a mild oxidizing agent such as hydrogen peroxide and an organofluoro silane such as described in U.S. Pat. No. 6,365,528, issued Apr. 2, 2002; and in Serial Nos. 09/792,683; 09/792,685; and 09/792,691, all filed on Feb. 23, 2001. All four of these cases are assigned to the assignee of this application, and the subject matter of all four cases is hereby incorporated by reference.

Over the layer of low k carbon-doped silicon oxide dielectric material (and over a silicon oxide capping layer if such is present) is formed the photoresist mask through which openings in the low k carbon-doped silicon oxide dielectric material such as vias and trenches will be formed. The photolithographic formation of the photoresist mask, and the etching of the openings in the low k carbon-doped silicon oxide dielectric material through this mask, may all be carried out in any conventional manner and form no part of this invention.

After etching of the desired openings in the low k carbon-doped silicon oxide dielectric material through the photoresist mask, the resist mask is removed from the integrated circuit structure, in accordance with the invention by first placing the substrate in a plasma etching chamber where the substrate is maintained at a temperature of from about 10° C. to about 100° C., preferably from about 20° C. to about 70° C., and most preferably from about 25° C. to about 35° C., by any convenient method such as by providing cooling means in the substrate support within the chamber. Maintaining the temperature within this range is desired due to the exothermic nature of the reaction between the reducing plasma and the photoresist material which produces radicals in the gaseous byproducts. The chamber is maintained at a low pressure ranging from about 200 millitorr to about 5 torr, preferably, from about 200 millitorr to about 1 torr. This low pressure range is desirable to thereby direct the flow of the radicals and ions to the surface of the substrate for improved selectivity of the plasma.

Into this etching chamber is flowed a supply of reducing gas such as, for example, hydrogen gas ($H_2$), ammonia ($NH_3$), a combination of both, or forming gas (10 vol. % $H_2$ in $N_2$). The use of a reducing gas, rather than an oxidizing gas, to remove the photoresist mask not only results in less damage to the underlying low k carbon-doped silicon oxide dielectric material, but also exhibits better etch selectivity between the resist material and the low k carbon-doped silicon oxide dielectric material than does an oxidizing plasma, i.e., the reducing plasma etches the resist in preference to the low k carbon-doped silicon oxide dielectric material. Additionally, while we do not wish to be bound by any theories of operation, when the reducing gas contains $NH_3$, the initial attack of the low k film by $NH_3$ is believed to form a silicon nitride ($Si_xN_y$) crust over the low k film which prevents or retards diffusion of $H^-$ into the low k film.

The reducing gas flow into the etching chamber will vary with chamber size, but should be equivalent to a flow into a ~10 liter chamber of from at least about 350 standard cubic centimeters per minute (sccm) of reducing gas to less than about 750 sccm, with the minimum flow rate governed by the minimum needed to generate and maintain the plasma, and with the maximum flow rate dictated by the exothermic reaction between the plasma components and the photoresist material.

The plasma of reducing gas is then ignited in the chamber and maintained until all of the resist mask has reacted with the plasma. The formation of a plasma for use in the process may take place by any of a plurality of methods for plasma formation known to those of skill in the art, including, for example, capacitively coupled plasma formation, inductively coupled plasma formation, and the like. Formation of the plasma may take place at a power of about 20 W to about 3000 W, preferably from about 100 W to about 1000 W, and most preferably from 400 W to about 700 W, with an rf bias on the substrate of about 500–600 volts.

The time period for removal of the resist mask will vary with the thickness of the resist mask, but may be determined either empirically for resists of equal thickness or by any other convenient end point such as an optical pyrometer. Upon reaching the end point of complete removal of the photoresist mask, the flow of reducing gas into the chamber may be shut off to extinguish the plasma. Typically, an extra overetch can be used to ensure that all resist is removed.

After removal of the photoresist mask in the etching chamber, the substrate is allowed to cool to room temperature after which it is removed from the etch chamber and moved to a washing station where the substrate surface is contacted with a solvent such as EKC 265, a hydroamine-based solvent commercially available from the EKC Company, or acetone or trichloroethylene. The solvent is used to dissolve and/or remove etch residues and byproducts remaining from both the etch to form the openings in the low k carbon-doped silicon oxide dielectric material (vias, trenches, contact openings), and the etch to remove the resist mask.

After the solvent treatment step, the substrate is washed with deionized (DI) water, dried, and then placed in an annealing chamber to remove any remaining absorbed moisture from the solvent treatment step as well, as to remove any remaining occluded gases or gaseous byproducts from the low k carbon-doped silicon oxide dielectric material on the substrate.

The annealing chamber having the substrate mounted therein is heated to a temperature of at least as high as any anticipated subsequent processing temperatures, usually at least about 350° C., and preferably at least about 400° C., and typically to about 420° C., and then maintained at this temperature for a period of at least about 30 minutes. During this time, into the annealing chamber may be flowed one or more non-reactive gases such as nitrogen or forming gas (10 vol. % $H_2$ in $N_2$), or one of the inert gases (e.g., He, Ar, or Ne), or a mixture of nonreactive gases, at a flow rate equivalent to a flow of about 8–9 liters per minute into a 12 liter annealing furnace, to purge the chamber of gaseous materials and etch residues from the low k carbon-doped silicon oxide dielectric material. In a preferred embodiment, however, rather than using the purging gases at the above high flow rates, the annealing chamber is maintained at a low pressure of, for example, 1 torr or less during the anneal, with a low flow (~200 sccm) of one or more of the above gases.

After the annealing step to remove remaining etch residues, gases, moisture, and the like, the openings formed in the low k carbon-doped silicon oxide dielectric material are ready to be filled with electrically conductive materials such as one or more metals or electrically conductive metal compounds. In one widely practiced procedure, the walls of such openings are first coated with a material such as titanium metal which facilitates bonding of the filler materials to the walls of the dielectric material, i.e., to act as the "glue" layer. A layer of electrically conductive titanium nitride is then formed over the titanium layer to function as a barrier layer which prevents chemical interaction between the main filler material, e.g., tungsten or aluminum, and other underlying portions of the structure, such as, for example, silicon or low k dielectric material. The main filler material such as tungsten or aluminum may then be deposited to fill up the openings.

The following example will serve to further illustrate the process of the invention. Two silicon semiconductor substrates, having identical integrated circuit structure formed thereon, including a layer of low k carbon-doped silicon oxide dielectric material and a photoresist mask thereon through which identical patterns of openings were already formed, may be processed as follows to remove the respective photoresist masks.

The first substrate may be processed in a etch chamber using a conventional ashing treatment with an oxygen plasma, and a conventional pressure and temperature as is common for such ashing processes. The second substrate is then treated in accordance with the process of the invention in the same etch chamber using an ammonia ($NH_3$) plasma at a pressure of about 0.3 torr, and a temperature of about 30° C.

Both the first and second substrates are then cleaned with the same solvent, rinsed, dried, and then identically filled conventionally with metal. When the two substrates are examined under a SEM microscope at 20,000× to 50,000×, it will be found that a higher percent of the openings in the layer of low k carbon-doped silicon oxide dielectric material are filled with metal in the substrate treated in accordance with the invention, i.e., the photoresist mask removed with the $NH_3$ reducing gas plasma rather then removed with an oxygen plasma. This will indicate that less damage occurred to the low k carbon-doped silicon oxide dielectric material when a reducing plasma was used to remove the photoresist mask in accordance with the invention.

When a substrate processed in accordance with the invention, as with the second substrate above (i.e., with a reducing gas plasma used to remove the photoresist mask), but also subjected to the annealing step of the invention as well, it will be found that the subsequent rate or percent of metal-filled openings will be further enhanced in the substrate subjected to the annealing step of the invention as well.

Thus, the invention provides an enhanced process for the removal of a photoresist mask over a low k carbon-doped silicon oxide dielectric material with damage to the low k carbon-doped silicon oxide dielectric material inhibited by the use of a reducing gas plasma. The invention further provides for the removal of the etch residues and byproducts of both the initial etch of the low k carbon-doped silicon oxide dielectric material through the mask and also the etch residues, byproducts, and moisture generated during the subsequent removal of the resist mask. The rate of successful filling of the openings in the low k carbon-doped silicon oxide dielectric material with electrically conductive material is thereby enhanced by the practice of the process of the invention.

Having thus described the invention what is claimed is:

1. A process for removing a photoresist mask after forming openings, through said photoresist mask, in an underlying layer of low k carbon-doped silicon oxide dielectric material of an integrated circuit structure formed on a semiconductor substrate, which comprises:
   a) placing said substrate in a reactor maintained at a pressure within a range of from about 200 millitorr to about 5 torr;
   b) flowing into said reactor a reducing gas selected from the group consisting of $NH_3$, $H_2$, forming gas, and a mixture of $NH_3$ and $H_2$;
   c) igniting a plasma in said reactor; and
   d) maintaining said plasma in said reactor at a power level of from about 100 watts to about 1000 watts until all of said photoresist mask is removed from said substrate.

2. The process for removing said photoresist mask of claim 1 wherein the flow rate of said reducing gas through said reactor is equivalent to a flow rate into a 10 liter reactor ranging from at least about 350 standard cubic centimeters per minute (sccm) to less than about 750 sccm.

3. The process for removing said photoresist mask of claim 1 wherein said reactor is maintained at a temperature within a range of from about 10° C. to about 100° C.

4. The process for removing said photoresist mask of claim 3 wherein said reactor is maintained at a temperature within a range of from about 20° C. to about 70° C.

5. The process of claim 1 including the further step of contacting said low k carbon-doped silicon oxide dielectric material with a solvent capable of removing etch residues left from forming said openings in said low k dielectric material, and from removing said photoresist mask used to form said openings in said low k carbon-doped silicon oxide dielectric material.

6. The process of claim 5 including the further step of annealing said substrate in an annealing chamber at a temperature sufficient to remove liquid and gaseous byproducts from said low k carbon-doped silicon oxide dielectric material.

7. The process of claim 6 wherein said annealing step is carried out while flowing one or more non-reactive gases through said annealing chamber.

8. The process of claim 6 wherein said annealing step is carried out while maintaining a pressure in said annealing chamber not exceeding 1 torr.

9. The process of claim 6 wherein said substrate is maintained at a temperature of at least about 350° C. for a period of at least about 20 minutes in said annealing chamber.

10. The process of claim 9 wherein said substrate is maintained at a temperature of at least about 420° C. in said annealing chamber.

11. The process of claim 9 wherein said substrate is maintained at said temperature of at least about 350° C. for a period of at least about 30 minutes in said annealing chamber.

12. A process for removing etch residues and a photoresist mask after forming openings, through said photoresist mask, in an underlying layer of low k carbon-doped silicon oxide dielectric material of an integrated circuit structure formed on a semiconductor substrate, which comprises:
   a) placing said substrate in a reactor maintained at a pressure within a range of from about 200 millitorr to about 5 torr, and at a temperature maintained within a range of from about 10° C. to about 100° C.;
   b) flowing into said reactor a reducing gas selected from the group consisting of $NH_3$, $H_2$, forming gas, and a mixture of $NH_3$ and $H_2$;
   c) igniting a plasma in said reactor;
   d) maintaining said plasma in said reactor at a power level of from about 100 watts to about 1000 watts until all of said photoresist mask is removed from said substrate;
   e) contacting said low k carbon-doped silicon oxide dielectric material with a solvent capable of dissolving etch residues left from forming said openings in said low k dielectric material, and from removing said photoresist mask; and
   f) annealing said substrate in the presence of a non-reactive gas in an annealing chamber at a pressure not exceeding 1 torr and at a temperature sufficient to remove liquid and gaseous byproducts from said low k carbon-doped silicon oxide dielectric material.

13. The process of claim 12 wherein said pressure in said annealing chamber does not exceed 500 millitorr.

14. The process of claim 12 wherein said substrate is maintained at a temperature of at least about 350° C. for a period of at least about 20 minutes in said annealing chamber.

15. The process of claim 12 wherein said substrate is maintained at a temperature of at least about 420° C. in said annealing chamber.

16. The process of claim 14 wherein said substrate is maintained at said temperature of at least about 350° C. for a period of at least about 30 minutes in said annealing chamber.

17. A process for removing a photoresist mask used to form openings in an underlying layer of low k carbon-doped silicon oxide dielectric material of an integrated circuit structure formed on a semiconductor substrate, which comprises exposing said photoresist mask in a plasma reactor to a plasma, formed using a reducing gas flowing through said plasma reactor at a flow rate equivalent to a flow rate into a 10 liter reactor ranging from at least about 350 standard cubic centimeters per minute (sccm) to less than about 750 sccm, said reducing gas selected from the group consisting of $NH_3$, $H_2$, forming gas, and a mixture of $NH_3$ and $H_2$, until said photoresist mask is removed.

18. The process for removing said photoresist mask of claim 17 wherein said plasma of reducing gas is maintained within a power range of from 20 W to about 3000 W.

19. The process for removing said photoresist mask of claim 17 wherein said photoresist mask is removed while maintaining the pressure in said reactor within a range of from about 200 millitorr to about 5 torr.

20. The process for removing said photoresist mask of claim 17 wherein said reactor is maintained at a temperature within a range of from about 10° C. to about 100° C.

21. The process for removing said photoresist mask of claim 17 wherein said reactor is maintained at a temperature within a range of from about 20° C. to about 70° C.

22. The process of claim 17 including the further step of contacting said low k carbon-doped silicon oxide dielectric material with a solvent capable of removing etch residues left from forming said openings in said low k dielectric material, and from removing said photoresist mask used to form said openings in said low k carbon-doped silicon oxide dielectric material.

23. The process of claim 22 including the further step of annealing said substrate in an annealing chamber at a temperature sufficient to remove liquid and gaseous byproducts from said low k carbon-doped silicon oxide dielectric material.

24. The process of claim 23 wherein said annealing step is carried out while flowing one or more non-reactive gases through said annealing chamber.

25. The process of claim 23 wherein said annealing step is carried out while maintaining a pressure in said annealing chamber not exceeding 1 torr.

26. The process of claim 23 wherein said substrate is maintained at a temperature of at least about 350° C. for a period of at least about 20 minutes in said annealing chamber.

27. The process of claim 26 wherein said substrate is maintained at said temperature of at least about 350° C. for a period of at least about 30 minutes in said annealing chamber.

28. The process of claim 26 wherein said substrate is maintained at a temperature of at least about 420° C. in said annealing chamber.

* * * * *